(12) United States Patent
Oie et al.

(10) Patent No.: US 10,651,028 B2
(45) Date of Patent: May 12, 2020

(54) SEMICONDUCTOR ELEMENT CLEANING SOLUTION THAT SUPPRESSES DAMAGE TO TUNGSTEN-CONTAINING MATERIALS, AND METHOD FOR CLEANING SEMICONDUCTOR ELEMENT USING SAME

(71) Applicant: MITSUBISHI GAS CHEMICAL COMPANY, INC., Chiyoda-ku (JP)

(72) Inventors: Toshiyuki Oie, Tokyo (JP); Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 55 days.

(21) Appl. No.: 15/505,654

(22) PCT Filed: Oct. 2, 2015

(86) PCT No.: PCT/JP2015/078075
§ 371 (c)(1),
(2) Date: Feb. 22, 2017

(87) PCT Pub. No.: WO2016/076031
PCT Pub. Date: May 19, 2016

(65) Prior Publication Data
US 2017/0278701 A1    Sep. 28, 2017

(30) Foreign Application Priority Data

Nov. 13, 2014    (JP) .................... 2014-230634

(51) Int. Cl.
*H01L 21/02* (2006.01)
*C11D 7/04* (2006.01)
(Continued)

(52) U.S. Cl.
CPC .......... *H01L 21/02041* (2013.01); *C11D 3/30* (2013.01); *C11D 3/43* (2013.01);
(Continued)

(58) Field of Classification Search
None
See application file for complete search history.

(56) References Cited

U.S. PATENT DOCUMENTS

2005/0287480 A1    12/2005    Takashima
2006/0287207 A1*   12/2006    Park .................... C11D 7/5013
                                                         510/175
(Continued)

FOREIGN PATENT DOCUMENTS

EP    3 193 359 A1    7/2017
EP    3 220 408 A1    9/2017
(Continued)

OTHER PUBLICATIONS

Machine Translation of JP2009-069505 by Takahashi et al., published Apr. 2, 2009.*

(Continued)

*Primary Examiner* — Mikhail Kornakov
*Assistant Examiner* — Ryan L. Coleman
(74) *Attorney, Agent, or Firm* — Oblon, McClelland, Maier & Neustadt, L.L.P.

(57) ABSTRACT

According to the present invention, it is possible to provide a cleaning solution which removes a photoresist on a surface of a semiconductor element having a low dielectric constant film (a low-k film) and a material that contains 10 atom % or more of tungsten, wherein the cleaning solution contains 0.001-5 mass % of an alkaline earth metal compound, 0.1-30 mass % of an inorganic alkali and/or an organic alkali, and water.

10 Claims, 1 Drawing Sheet

(51) Int. Cl.

| | | |
|---|---|---|
| *C11D 17/08* | (2006.01) | |
| *C11D 7/12* | (2006.01) | |
| *C11D 7/06* | (2006.01) | |
| *C11D 7/32* | (2006.01) | |
| *H01L 21/311* | (2006.01) | |
| *H01L 21/304* | (2006.01) | |
| *C11D 3/30* | (2006.01) | |
| *C11D 3/43* | (2006.01) | |
| *C11D 11/00* | (2006.01) | |
| *G03F 7/42* | (2006.01) | |
| *C22C 38/12* | (2006.01) | |

(52) U.S. Cl.
CPC ............... *C11D 7/04* (2013.01); *C11D 7/06* (2013.01); *C11D 7/12* (2013.01); *C11D 7/32* (2013.01); *C11D 11/0047* (2013.01); *C11D 17/08* (2013.01); *G03F 7/422* (2013.01); *G03F 7/425* (2013.01); *H01L 21/304* (2013.01); *H01L 21/31133* (2013.01); *C22C 38/12* (2013.01)

(56) References Cited

U.S. PATENT DOCUMENTS

| | | |
|---|---|---|
| 2007/0235684 A1 | 10/2007 | Mistkawi et al. |
| 2008/0242102 A1* | 10/2008 | Keating ............ C11D 7/263 438/745 |
| 2009/0118153 A1 | 5/2009 | Rath et al. |
| 2011/0129998 A1 | 6/2011 | Eto et al. |
| 2011/0281436 A1 | 11/2011 | Inaba et al. |
| 2015/0152366 A1 | 6/2015 | Shimada et al. |
| 2015/0307818 A1 | 10/2015 | Barnes et al. |

FOREIGN PATENT DOCUMENTS

| | | | |
|---|---|---|---|
| JP | 8-334905 | A | 12/1996 |
| JP | 2001-26890 | A | 1/2001 |
| JP | 2003-223010 | A | 8/2003 |
| JP | 2003-257922 | A | 9/2003 |
| JP | 2003-316028 | A | 11/2003 |
| JP | 2005-292288 | A | 10/2005 |
| JP | 2007-510307 | A | 4/2007 |
| JP | 2007-298930 | A | 11/2007 |
| JP | 2008-216843 | A | 9/2008 |
| JP | 2008-285508 | A | 11/2008 |
| JP | 2009-21516 | A | 1/2009 |
| JP | 2009-069505 | * | 4/2009 |
| JP | 2009-516360 | A | 4/2009 |
| JP | 2009-527131 | A | 7/2009 |
| JP | 2009-209431 | A | 9/2009 |
| JP | 2011-118101 | A | 6/2011 |
| JP | 2011-243610 | A | 12/2011 |
| JP | 2012-9513 | A | 1/2012 |
| JP | 2013-533631 | A | 8/2013 |
| WO | 2005/043245 | A2 | 5/2005 |
| WO | 2013/187313 | A1 | 12/2013 |

OTHER PUBLICATIONS

International Search Report dated Nov. 17, 2015 in PCT/JP2015/078075 filed Oct. 2, 2015.

* cited by examiner

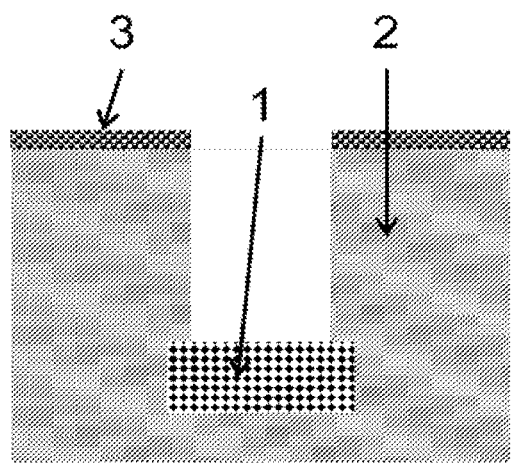

SEMICONDUCTOR ELEMENT CLEANING SOLUTION THAT SUPPRESSES DAMAGE TO TUNGSTEN-CONTAINING MATERIALS, AND METHOD FOR CLEANING SEMICONDUCTOR ELEMENT USING SAME

TECHNICAL FIELD

The present invention relates to a cleaning solution, which suppresses damage to a low dielectric constant film and a tungsten-containing material and removes a photoresist on a surface of a semiconductor element in the process for manufacturing the semiconductor element having the low dielectric constant film and the tungsten-containing material, and a cleaning method using the same.

BACKGROUND ART

The production of a highly integrated semiconductor element generally has a series of processes as follows: a conductive thin film such as a metal film as a conductive wiring material and an interlayer dielectric film for insulation between conductive thin films are formed on an element such as a silicon wafer; after that, a photoresist is uniformly applied to the surface thereof to provide a photosensitive layer, and this is subjected to the selective exposure/development treatment to form a desired resist pattern; then the dry etching treatment is applied to the interlayer dielectric film using the resist pattern as a mask to form a desired pattern on the thin film; and then the photoresist is completely removed by ashing with oxygen plasma or cleaning with a cleaning solution.

Recently, the miniaturization of design rules has been accelerated, and the limit of high-speed arithmetic processing has been gradually controlled by signal transmission delay. For this reason, the conductive wiring material has been changed from aluminium to copper which has lower electrical resistance, and the interlayer dielectric film has been changed from a silicone oxide film to a low dielectric constant film (a film having a dielectric constant of less than 3, hereinafter referred to as "low-k film"). With the miniaturization of wiring, a material containing tungsten having high heat resistance is used for a contact plug for connection to a substrate. In addition, with the miniaturization of design rules, the constitution of the gate of the transistor has been gradually changed from a combination of silicon oxide and polycrystalline silicon to a combination of a high dielectric constant material and a metal. There is a case where a tungsten-containing material is used as this metal. Further, in aluminium wirings, a tungsten-containing material is used for a contact plug which connects wirings of different layers.

In the process for manufacturing a semiconductor element using a tungsten-containing material, when a photoresist is removed with oxygen plasma, there is a problem that a low-k film is damaged due to exposure to oxygen plasma or the like, resulting in significant deterioration of electrical characteristics. In addition, the tungsten-containing material is damaged due to exposure to oxygen plasma or the like, resulting in problems in production processes after that. For this reason, in the production of a semiconductor element using a low-k film and a tungsten-containing material, it is desired to suppress damage to the low-k film and the tungsten-containing material while removing a photoresist at a level comparable to that of an oxygen plasma process.

Regarding the treatment with a cleaning solution, it is known that a photoresist can be removed by using an alkaline cleaning solution. However, when the alkaline cleaning solution is brought into contact with a tungsten-containing material, it may be significantly damaged. Meanwhile, alkaline cleaning solutions capable of effectively removing a photoresist, wherein damage to a tungsten-containing material is reduced, have been proposed (Patent Documents 1, 4, 8 and 9), but these cannot suppress damage to a low-k film. Under such circumstances, it is desired to develop an alkaline cleaning solution capable of effectively removing a photoresist without damage to a tungsten-containing material and a low-k film.

Patent Document 1 proposes a wiring forming method using a cleaning solution containing potassium hydroxide, quaternary ammonium hydroxide, an organic solvent, pyrazole and water. When using this cleaning solution, it is possible to suppress damage to a tungsten-containing material while removing a photoresist, but damage to a low-k film cannot be suppressed. Therefore, this cleaning solution cannot be used for the above-described purpose (see Comparative Examples 6 and 7).

Patent Document 2 proposes a wiring forming method using a cleaning solution containing a fluorine compound, a metal corrosion inhibitor, a passivator and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 8).

Patent Document 3 proposes a wiring forming method using a cleaning solution containing ammonium fluoride, gluconic acid and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 9).

Patent Document 4 proposes a wiring forming method using a cleaning solution containing phosphoric acid, hydrochloric acid, amine, an alanine type surfactant and water. When using this cleaning solution, it is possible to suppress damage to a tungsten-containing material while removing a photoresist, but damage to a low-k film cannot be suppressed. Therefore, this cleaning solution cannot be used for the above-described purpose (see Comparative Examples 10 and 11).

Patent Document 5 proposes a wiring forming method using a cleaning solution containing hydrogen peroxide, a triazole and water. When using this cleaning solution, it is possible to suppress damage to a low-k film, but it is impossible to remove a photoresist and suppress damage to a tungsten-containing material. Therefore, this cleaning solution cannot be used for the above-described purpose (see Comparative Example 12).

Patent Document 6 proposes a wiring forming method using a cleaning solution containing hydrogen peroxide, quaternary ammonium hydroxide, quaternary ammonium salt and water. When using this cleaning solution, it is possible to suppress damage to a low-k film, but it is impossible to remove a photoresist and suppress damage to a tungsten-containing material. Therefore, this cleaning solution cannot be used for the above-described purpose (see Comparative Example 13).

Patent Document 7 proposes a wiring forming method using a cleaning solution containing amine, hydroxylamine salt, quaternary ammonium hydroxide, an organic acid, an organic solvent and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 14).

Patent Document 8 proposes a wiring forming method using a cleaning solution containing N,N-diethylhydroxylamine, hydroxylamine, a water-soluble organic solvent, a metal anticorrosive and water. When using this cleaning solution, it is possible to suppress damage to a tungsten-containing material while removing a photoresist, but damage to a low-k film cannot be suppressed. Therefore, this cleaning solution cannot be used for the above-described purpose (see Comparative Examples 15 and 16).

Patent Document 9 proposes a wiring forming method using a cleaning solution containing an inorganic base, quaternary ammonium hydroxide, an organic solvent, azole and water. When using this cleaning solution, it is possible to suppress damage to a tungsten-containing material while removing a photoresist, but damage to a low-k film cannot be suppressed. Therefore, this cleaning solution cannot be used for the above-described purpose (see Comparative Examples 17 and 18).

Patent Document 10 proposes a wiring forming method using a cleaning solution containing hydrogen peroxide, hydrofluoric acid, an organic solvent, azole and water. However, when using this cleaning solution, it is impossible to remove a photoresist. Moreover, it is impossible to suppress damage to a tungsten-containing material and a low-k film. Therefore, this cleaning solution cannot be used for the above-described purpose (see Comparative Example 19).

Patent Document 11 proposes a wiring forming method using a cleaning solution containing hydrofluoric acid, an organic solvent, azole and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 20).

Patent Document 12 proposes a wiring forming method using a cleaning solution containing hydrofluoric acid, a silicon-containing compound, a surfactant, carboxylic acid, an anticorrosive and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 21).

Patent Document 13 proposes a wiring forming method using a cleaning solution containing a sugar, a hydroxylamine, a quaternary ammonium compound, an organic acid and water. When using this cleaning solution, it is possible to suppress damage to a low-k film, but it is impossible to remove a photoresist and suppress damage to a tungsten-containing material. Therefore, this cleaning solution cannot be used for the above-described purpose (see Comparative Example 22).

Patent Documents 14 and 15 propose a wiring forming method using a cleaning solution containing an acid or salt thereof, a chelating agent containing nitrogen atoms, an organic solvent and water. When using this cleaning solution, it is possible to suppress damage to a tungsten-containing material, but it is impossible to remove a photoresist and suppress damage to a low-k film. Therefore, this cleaning solution cannot be used for the above-described purpose (see Comparative Example 23).

Patent Document 16 proposes a wiring forming method using a cleaning solution containing an alkali and $W_zMX_y$ (in the formula: M represents a metal selected from the group consisting of Si, Ge, Sn, Pt, P, B, Au, Ir, Os, Cr, Ti, Zr, Rh, Ru and Sb; X represents a halide selected from the group consisting of F, Cl, Br and I; W is selected from H, an alkali or alkaline earth metal, and a metal-ion-free hydroxide base moiety; y represents a number of from 4 to 6 depending on a metal halide; and z represents a number of 1, 2 or 3). However, when using this cleaning solution, it is impossible to remove a photoresist. Moreover, it is impossible to suppress damage to a tungsten-containing material and a low-k film. Therefore, this cleaning solution cannot be used for the above-described purpose (see Comparative Example 24). Further, a cleaning solution, in which $W_zMX_y$ described in Patent Document 16 is blended in the cleaning solution of the present invention instead of the alkaline earth metal compound that is blended for the purpose of suppressing damage to the tungsten-containing material, cannot suppress damage to the tungsten-containing material and damages the low-k film (see Comparative Example 25).

PRIOR ART DOCUMENTS

Patent Documents

Patent Document 1: International Publication WO2013/187313 pamphlet
Patent Document 2: Japanese National-phase PCT Laid-Open Patent Publication No. 2013-533631
Patent Document 3: Japanese Laid-Open Patent Publication No. 2007-298930
Patent Document 4: Japanese Laid-Open Patent Publication No. 2003-316028
Patent Document 5: Japanese Laid-Open Patent Publication No. 2001-026890
Patent Document 6: Japanese Laid-Open Patent Publication No. 2008-285508
Patent Document 7: Japanese Laid-Open Patent Publication No. 2011-243610
Patent Document 8: Japanese Laid-Open Patent Publication No. H08-334905
Patent Document 9: Japanese Laid-Open Patent Publication No. 2011-118101
Patent Document 10: Japanese Laid-Open Patent Publication No. 2009-21516
Patent Document 11: Japanese Laid-Open Patent Publication No. 2009-209431
Patent Document 12: Japanese Laid-Open Patent Publication No. 2009-527131
Patent Document 13: Japanese Laid-Open Patent Publication No. 2012-009513
Patent Document 14: Japanese Laid-Open Patent Publication No. 2003-257922
Patent Document 15: Japanese Laid-Open Patent Publication No. 2003-223010
Patent Document 16: Japanese National-phase PCT Laid-Open Patent Publication No. 2007-510307

SUMMARY OF THE INVENTION

Problems to be Solved by the Invention

The purpose of the present invention is to provide: a cleaning solution, which suppresses damage to a low-k film and a tungsten-containing material and removes a photoresist on a surface of a semiconductor element in the process for manufacturing the semiconductor element having the low-k film and the tungsten-containing material; and a cleaning method using the same.

Means for Solving the Problems

The above-described problems can be solved by the present invention. Specifically, the present invention is as follows:
<1> A cleaning solution which removes a photoresist on a surface of a semiconductor element having a low dielectric constant film (a low-k film) and a material that contains 10 atomic % or more of tungsten, wherein the cleaning solution contains 0.001 to 5% by mass of an alkaline earth metal compound, 0.1 to 30% by mass of an inorganic alkali and/or an organic alkali, and water.
<2> The cleaning solution according to item <1>, wherein the pH value of the cleaning solution is 10 to 14.
<3> The cleaning solution according to item <1> or <2>, wherein the material that contains 10 atomic % or more of tungsten is at least one substance selected from the group consisting of tungsten oxide, tungsten nitride, tungsten and tungsten silicide.
<4> The cleaning solution according to any one of items <1> to <3>, wherein the alkaline earth metal compound is at least one substance selected from the group consisting of a calcium compound, a strontium compound and a barium compound.
<5> The cleaning solution according to any one of items <1> to <4>, wherein the inorganic alkali is at least one substance selected from the group consisting of lithium hydroxide, lithium carbonate, lithium hydrogen carbonate, lithium acetate, sodium hydroxide, sodium carbonate, sodium hydrogen carbonate, sodium acetate, potassium hydroxide, potassium carbonate, potassium hydrogen carbonate, potassium acetate, cesium hydroxide, cesium carbonate, cesium hydrogen carbonate, cesium acetate and ammonia, and wherein the organic alkali is at least one substance selected from the group consisting of tetramethylammonium hydroxide, tetraethylammonium hydroxide, tetrapropylammonium hydroxide, tetrabutylammonium hydroxide, choline, methylamine, dimethylamine, trimethylamine, ethylamine, diethylamine, triethylamine, propylamine, dipropylamine, butylamine, dibutylamine, pentylamine, hexylamine, heptylamine, octylamine, ethanolamine, 2-methylethanolamine, diethanolamine, triethanolamine and 1-amino-2-propanol.
<6> The cleaning solution according to any one of items <1> to <5>, substantially not containing a peroxide, a perchloric acid or a perchlorate.
<7> A cleaning method for removing a photoresist on a surface of a semiconductor element having a low dielectric constant film (a low-k film) and a material that contains 10 atomic % or more of tungsten, wherein the cleaning solution according to any one of items <1> to <6> is used.

Advantageous Effect of the Invention

By employing the cleaning solution of the present invention and the cleaning method using the same, it is possible to suppress damage to a low-k film and a tungsten-containing material and selectively remove a photoresist on a surface of a product to be treated in the process for manufacturing a semiconductor element, and it is possible to produce a semiconductor element having high precision and high quality with a high yield.

BRIEF DESCRIPTION OF THE DRAWINGS

FIG. 1 is a schematic cross sectional view showing an example of the structure of a semiconductor element including a tungsten-containing material and a low-k film prior to removal of a photoresist.

EMBODIMENTS FOR CARRYING OUT THE INVENTION

The cleaning solution of the present invention is used in the cleaning process in the production of a semiconductor element, and in this case, a photoresist can be cleaned/removed at a quite satisfactory level, and it is possible to suppress damage to a low-k film and a tungsten-containing material.

The tungsten-containing material included in the semiconductor element to which the cleaning solution of the present invention is applied is a material containing 10 atomic % or more of tungsten, and the atomic composition percentage of tungsten is preferably 15 atomic % or more, more preferably 20 atomic % or more, even more preferably 25 atomic % or more, and particularly preferably 30 atomic % or more. Specific examples of the tungsten-containing material include tungsten oxide, tungsten nitride, tungsten and tungsten silicide, and preferred are tungsten oxide, tungsten nitride and tungsten. However, the tungsten-containing material is not limited thereto as long as it is a material containing 10 atomic % or more of tungsten.

In the present invention, the content of tungsten can be examined by measuring the constituent ratio of tungsten atoms in the targeted tungsten-containing material according to the ion sputtering method of X-ray photoelectron spectroscopy (XPS). The vicinity of the surface of the tungsten-containing material is oxidized, and therefore the constituent ratio of oxygen atoms therein may be higher than that in the inner part of the material. For this reason, the surface of the tungsten-containing material is etched by ion sputtering until the constituent ratio of tungsten atoms and oxygen atoms becomes constant, thereby measuring the constituent ratio of tungsten atoms in the inner portion of the tungsten-containing material exposed by ion sputtering. As a measurement apparatus, a fully automatic XPS analyzer K-Alpha (manufactured by Thermo Fisher Scientific Inc.) can be used.

The concentration of the alkaline earth metal compound contained in the cleaning solution of the present invention is 0.001 to 5% by mass, preferably 0.005 to 3% by mass, even more preferably 0.01 to 1% by mass, and particularly preferably 0.05 to 0.8% by mass. When the concentration is within the above-described range, corrosion of the tungsten-containing material can be effectively prevented. When the concentration exceeds 5% by mass, photoresist removability may be reduced.

The present inventors found for the first time that the alkaline earth metal compound contained in the cleaning solution exerts anticorrosive effects on the tungsten-containing material. The mechanism thereof has not been elucidated, but it is considered that the alkaline earth metal compound adsorbs to the surface of tungsten, thereby preventing corrosion of tungsten caused by an alkali contained in the cleaning solution.

Specific examples of the alkaline earth metal compound include a calcium compound, a strontium compound and a barium compound. More specific examples thereof include, but are not limited to, barium nitrate, barium hydroxide, barium chloride, barium acetate, barium oxide, barium bromide, barium carbonate, barium fluoride, barium iodide, barium sulfate, barium phosphate, calcium nitrate, calcium chloride, calcium acetate, calcium hydroxide, calcium bromide, calcium carbonate, calcium fluoride, calcium iodide, calcium sulfate, calcium phosphate, strontium carbonate, strontium chloride, strontium acetate, strontium hydroxide, strontium bromide, strontium fluoride, strontium iodide, strontium sulfate and strontium phosphate.

Among them, barium nitrate, barium hydroxide, barium chloride, barium acetate, barium oxide, barium bromide, barium carbonate, barium fluoride, barium iodide, barium sulfate, barium phosphate, calcium nitrate and strontium chloride are preferred.

These alkaline earth metal compounds may be used solely, or two or more of them may be used in combination.

The concentration of the inorganic alkali and/or the organic alkali contained in the cleaning solution of the present invention (when both of them are used, the total thereof) is 0.1 to 30% by mass, preferably 0.5 to 25% by mass, more preferably 1 to 20% by mass, and particularly preferably 2 to 15% by mass. When the concentration is within the above-described range, corrosion of the tungsten-containing material can be effectively prevented. When the concentration exceeds 30% by mass, the low-k film may be damaged.

Examples of the inorganic alkali to be used in the present invention include, but are not limited to, lithium hydroxide, lithium carbonate, lithium hydrogen carbonate, lithium acetate, sodium hydroxide, sodium carbonate, sodium hydrogen carbonate, sodium acetate, potassium hydroxide, potassium carbonate, potassium hydrogen carbonate, potassium acetate, cesium hydroxide, cesium carbonate, cesium hydrogen carbonate, cesium acetate and ammonia.

Among them, potassium hydroxide and ammonia are preferred.

Meanwhile, examples of the organic alkali include, but are not limited to, tetramethylammonium hydroxide, tetraethyl ammonium hydroxide, tetrapropylammonium hydroxide, tetrabutylammonium hydroxide, choline, methylamine, dimethylamine, trimethylamine, ethylamine, diethylamine, triethylamine, propylamine, dipropylamine, butylamine, dibutylamine, pentylamine, hexylamine, heptylamine, octylamine, ethanolamine, 2-methylethanolamine, diethanolamine, triethanolamine and 1-amino-2-propanol.

Among them, tetramethylammonium hydroxide and triethylamine are preferred.

These alkalis may be used solely, or two or more of them may be used in combination.

The water contained in the cleaning solution of the present invention is preferably water from which metal ions, organic impurities, particles, etc. have been removed by distillation, ion exchange treatment, filtering treatment, adsorption treatment or the like, and pure water and ultra-pure water are particularly preferred. Further, the concentration of water in the cleaning solution is preferably 40% by mass or more, more preferably 50% by mass or more, and even more preferably 60% by mass or more. In this regard, the concentration of water means the remaining portion of the cleaning solution from which agents are excluded.

The pH value of the cleaning solution of the present invention is preferably 10 to 14, more preferably 11 to 14, even more preferably 11.4 to 14, and particularly preferably 12 to 14. When the pH value is within the above-described range, damage to the tungsten-containing material can be effectively suppressed, and the photoresist on the surface of the product to be treated can be selectively removed.

The cleaning solution of the present invention substantially does not contain a peroxide, a perchloric acid or a perchlorate. The word "substantially" as used herein means that the total amount of the peroxide, the perchloric acid and the perchlorate is less than 1% by mass. In one embodiment, the cleaning solution of the present invention does not contain the peroxide, the perchloric acid or the perchlorate at all. Specific examples of the peroxide include hydrogen peroxide, urea peroxide, m-chloroperoxybenzoic acid, tert-butyl hydroperoxide, peracetic acid, di-tert-butyl peroxide, benzoyl peroxide, acetone peroxide, methyl ethyl ketone peroxide, hexamethylene triperoxide, cumene hydroperoxide, lithium peroxide, potassium peroxide, sodium peroxide, rubidium peroxide, cesium peroxide, beryllium peroxide, magnesium peroxide, calcium peroxide, strontium peroxide, barium peroxide, zinc peroxide, cadmium peroxide and copper peroxide. Meanwhile, specific examples of the perchloric acid and the perchlorate include perchloric acid, ammonium perchlorate, potassium perchlorate, calcium perchlorate, magnesium perchlorate, silver perchlorate, sodium perchlorate, barium perchlorate, lithium perchlorate, zinc perchlorate, acetylcholine perchlorate, lead perchlorate, rubidium perchlorate, cesium perchlorate, cadmium perchlorate, iron perchlorate, aluminium perchlorate, strontium perchlorate, tetrabutylammonium perchlorate, lanthanum perchlorate, indium perchlorate and tetra-n-hexyl ammonium perchlorate.

In the cleaning solution of the present invention, an additive which is conventionally used in semiconductor cleaning solutions may be blended within a range in which the purpose of the present invention is not impaired. For example, as the additive, an oxidant other than the peroxide described above, an acid, a metal anticorrosive, a water-soluble organic solvent, a fluorine compound, a reducing agent, a chelating agent, a surfactant, a defoaming agent, etc. may be added.

The temperature at which the cleaning solution of the present invention is used is 10 to 85° C., preferably 30 to 70° C., and may be appropriately selected depending on etching conditions and a semiconductor element to be used.

With the cleaning method of the present invention, ultrasonic may be used in combination according to need.

The time for use of the cleaning solution of the present invention is 0.1 to 120 minutes, preferably 1 to 60 minutes, and may be appropriately selected depending on etching conditions and a semiconductor element to be used.

As a rinse liquid to be used after use of the cleaning solution of the present invention, an organic solvent such as alcohol can be used, but it is sufficient to just rinse the semiconductor element with water.

As a general low-k film, a hydroxysilsesquioxane (HSQ)-based or methylsilsesquioxane (MSQ)-based OCD (trade name, manufactured by Tokyo Ohka Kogyo Co., Ltd.), a carbon-doped silicon oxide (SiOC)-based Black Diamond (trade name, manufactured by Applied Materials), Aurora (trade name, manufactured by ASM International), Coral (trade name, manufactured by Novellus Systems) and an inorganic Orion (trade name, manufactured by Trikon Technologies) can be used, but the low-k film is not limited thereto.

EXAMPLES

Hereinafter, the present invention will be described in more detail based on Examples and Comparative Examples, but the present invention is not limited by the Examples.

SEM Observation:

Observation of conditions before and after the cleaning/removal treatment of the semiconductor element was carried out using the below-described SEM (scanning electron microscope) apparatus (100,000×).

Measurement apparatus: ultra-high resolution field-emission scanning electron microscope SU9000 manufactured by Hitachi High-Technologies Corporation Judgment:

The judgment after cleaning/removal was made after SEM observation based on the below-described criteria.

I. Removal State of Photoresist
  E: The photoresist was completely removed.
  G: The photoresist was almost removed.
  P: The photoresist was insufficiently removed.
  E and G are regarded as acceptable.

II. Damage to Tungsten-Containing Material
  E: The tungsten-containing material showed no change compared to that prior to cleaning.
  G: The tungsten-containing material showed slight change compared to that prior to cleaning.
  P: The tungsten-containing material showed change in its shape.
  E and G are regarded as acceptable.

III. Damage to Low-k Film
  E: The low-k film showed no change compared to that prior to cleaning.
  G: The low-k film showed slight change compared to that prior to cleaning.
  P: The low-k film showed change in its shape.
  F: The low-k film showed significant change in its shape.
  E and G are regarded as acceptable.

Examples 1-10

A semiconductor element having a wiring structure whose cross-sectional surface is as shown in FIG. 1 was used in the test to examine cleaning effects. In order to remove a photoresist 3, the semiconductor element was immersed in a cleaning solution shown in Table 1 at a temperature and for a period of time shown in Table 2. During immersion, a stirring bar was rotated at 350 rpm in the cleaning solution. After that, rinsing with ultrapure water and drying by dry nitrogen gas jet were carried out. The semiconductor element after cleaning was observed by SEM to judge the removal state of the photoresist 3 (FIG. 1) and damage to a tungsten-containing material 1 (FIG. 1) and a low-k film 2 (FIG. 1). The tungsten-containing material used in the test was tungsten oxide, and 30 atomic % of tungsten was contained.

The content of tungsten was measured according to the ion sputtering method of X-ray photoelectron spectroscopy (XPS) as described above. In each case, as a measurement apparatus, a fully automatic XPS analyzer K-Alpha (manufactured by Thermo Fisher Scientific Inc.) was used.

It is understood that in Examples 1-10 to which the cleaning solution of the present invention shown in Table 2 was applied, damage to the tungsten-containing material 1 and the low-k film 2 was prevented while the photoresist 3 was completely removed.

Comparative Examples 1-5

The semiconductor element shown in FIG. 1 was cleaned with a cleaning solution (Table 3, cleaning solutions 2A to 2D) in which barium nitrate (alkaline earth metal compound) was not added in the cleaning solution used in Examples 1-5 (Table 1, cleaning solutions 1A to 1D). Cleaning conditions and results of cleaning are shown in Table 5. When compared to the cleaning solutions in which barium nitrate was added to the cleaning solutions 2A to 2D shown in Comparative Examples 1-5 (Table 1, cleaning solutions 1A to 1D), there was no difference of removability of the photoresist 3 and damage to the low-k film 2 between them, but the tungsten-containing material 1 was damaged in each case. Accordingly, it is understood that the cleaning solutions 2A to 2D cannot be used for the purpose of suppressing damage to the tungsten-containing material and the low-k film and removing the photoresist on the surface of the product to be treated in the process for manufacturing the semiconductor element that is the target of the present invention (Table 5). In addition, according to these and Examples 6-10, it is understood that the alkaline earth metal compound is useful for suppressing damage to the tungsten-containing material 1 without deterioration of removability of the photoresist 3.

Comparative Examples 6 and 7 (the Invention Described in Patent Document 1)

The semiconductor element shown in FIG. 1 was cleaned with a cleaning solution containing 0.005% by mass of potassium hydroxide, 10% by mass of tetramethylammonium hydroxide, 50% by mass of diethylene glycol monomethyl ether, 0.1% by mass of pyrazole and 38.895% by mass of water (Table 4, cleaning solution 2E). Cleaning conditions and evaluation results are shown in Table 5. When cleaning the semiconductor element with this cleaning solution at 50° C. for 20 minutes, the photoresist was successfully removed, but both the tungsten-containing material and the low-k film were damaged (Comparative Example 6). When the temperature and the immersion time were respectively decreased to 25° C. and 0.5 minutes in order to suppress damage to the tungsten-containing material and the low-k film, the tungsten-containing material was not damaged, but it was impossible to remove the photoresist and the low-k film was damaged (Comparative Example 7). Accordingly, it is understood that the cleaning solution 2E cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 8 (the Invention Described in Patent Document 2)

The semiconductor element shown in FIG. 1 was cleaned with a cleaning solution containing 0.1% by mass of benzotriazol, 0.1% by mass of 1,2,4-triazole, 5% by mass of ammonium fluoride, 1% by mass of boric acid and 93.8% by mass of water (Table 4, cleaning solution 2F). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2F cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 9 (the Invention Described in Patent Document 3)

The semiconductor element shown in FIG. 1 was cleaned with a cleaning solution containing 0.25% by mass of ammonium fluoride, 0.06% by mass of gluconic acid and 99.69% by mass of water (Table 4, cleaning solution 2G). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2G cannot be used for the purpose of suppressing damage to the tungsten-containing material and the low-k film and removing the photoresist on the surface of the product to be treated in the process for manufacturing the semiconductor element that is the target of the present invention (Table 5).

Comparative Examples 10 and 11 (the Invention Described in Patent Document 4)

The semiconductor element shown in FIG. 1 was cleaned with a cleaning solution containing 1.35% by mass of phosphoric acid, 1% by mass of hydrochloric acid, 5% by mass of tetramethylammonium hydroxide, 0.01% by mass of sodium lauryl diaminoethyl glycinate and 92.64% by mass of water (Table 4, cleaning solution 2H). Cleaning conditions and evaluation results are shown in Table 5. When cleaning the semiconductor element with this cleaning solution for 6 minutes, the photoresist was successfully removed without damage to the tungsten-containing material, but the low-k film was damaged (Comparative Example 10). When the immersion time was decreased to 4 minutes in order to suppress damage to the low-k film, the tungsten-containing material was not damaged, but it was impossible to remove the photoresist and the low-k film was damaged (Comparative Example 11). Accordingly, it is understood that the cleaning solution 2H cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 12 (the Invention Described in Patent Document 5)

The semiconductor element shown in FIG. 1 was cleaned with a cleaning solution containing 5% by mass of hydrogen peroxide, 0.01% by mass of aminotriazole and 94.99% by mass of water (Table 4, cleaning solution 2I). Cleaning conditions and evaluation results are shown in Table 5. When using this cleaning solution, damage to the low-k film was successfully suppressed, but it was impossible to remove the photoresist and the tungsten-containing material was damaged. Accordingly, it is understood that the cleaning solution 2I cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 13 (the Invention Described in Patent Document 6)

The semiconductor element shown in FIG. 1 was cleaned with a cleaning solution containing 15% by mass of hydrogen peroxide, 0.2% by mass of benzyltrimethylammonium hydroxide, 0.001% by mass of Ethoquad O/12 [oleylbis(2-hydroxyethyl)methylammonium-bis(trifluoromethanesulfonyl)imide] (manufactured by Lion Corporation) and 84.799% by mass of water (Table 4, cleaning solution 2J). Cleaning conditions and evaluation results are shown in Table 5. When using this cleaning solution, damage to the low-k film was successfully suppressed, but it was impossible to remove the photoresist and the tungsten-containing material was damaged. Accordingly, it is understood that the cleaning solution 2J cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 14 (the Invention Described in Patent Document 7)

The semiconductor element shown in FIG. 1 was cleaned with a cleaning solution containing 1.9% by mass of octyl amine, 6% by mass of hydroxylamine sulfate, 4.9% by mass of tetramethylammonium hydroxide, 2% by mass of formic acid, 8% by mass of 2-methyl-4-pentanediol and 77.2% by mass of water (Table 4, cleaning solution 2K). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2K cannot be used for the purpose of suppressing damage to the tungsten-containing material and the low-k film and removing the photoresist on the surface of the product to be treated in the process for manufacturing the semiconductor element that is the target of the present invention (Table 5).

Comparative Examples 15 and 16 (the Invention Described in Patent Document 8)

The semiconductor element shown in FIG. 1 was cleaned with a cleaning solution containing 20% by mass of N,N-diethylhydroxylamine, 2% by mass of hydroxylamine, 53% by mass of dimethyl sulfoxide, 10% by mass of catechol and 15% by mass of water (Table 4, cleaning solution 2L). Cleaning conditions and evaluation results are shown in Table 5. When cleaning the semiconductor element with this cleaning solution at 50° C. for 1 minute, the photoresist was successfully removed without damage to the tungsten-containing material, but the low-k film was damaged (Comparative Example 15). When the immersion time was decreased to 0.2 minute in order to suppress damage to the low-k film, the tungsten-containing material was not damaged, but it was impossible to remove the photoresist and the low-k film was damaged (Comparative Example 16). Accordingly, it is understood that the cleaning solution 2L cannot be used for the purpose of suppressing damage to the tungsten-containing material and the low-k film and removing the photoresist on the surface of the product to be treated in the process for manufacturing the semiconductor element that is the target of the present invention (Table 5).

Comparative Examples 17 and 18 (the Invention Described in Patent Document 9)

The semiconductor element shown in FIG. 1 was cleaned with a cleaning solution containing 10% by mass of tetramethylammonium hydroxide, 0.02% by mass of potassium hydroxide, 2% by mass of 2-phenyl-4-methylimidazole, 20% by mass of diethylene glycol monomethyl ether and 67.98% by mass of water (Table 4, cleaning solution 2M). Cleaning conditions and evaluation results are shown in Table 5. When cleaning the semiconductor element with this cleaning solution at 50° C. for 10 minutes, the photoresist was successfully removed, but the tungsten-containing material and the low-k film were damaged (Comparative Example 17). When the immersion temperature was decreased to 30° C. and the treatment time was decreased to 1 minute in order to suppress damage to the tungsten-containing material and the low-k film, the tungsten-containing material was not damaged, but it was impossible to remove the photoresist and the low-k film was damaged (Comparative Example 18). Accordingly, it is understood that the cleaning solution 2M cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 19 (the Invention Described in Patent Document 10)

The semiconductor element shown in FIG. 1 was cleaned with a cleaning solution containing 14% by mass of hydrogen peroxide, 0.3% by mass of hydrofluoric acid, 58.4% by mass of diethylene glycol monomethyl ether, 1% by mass of vinylimidazole and 26.3% by mass of water (Table 4, cleaning solution 2N). Cleaning conditions and evaluation results are shown in Table 5. When using this cleaning solution, it was impossible to remove the photoresist, and the tungsten-containing material and the low-k film were damaged. Accordingly, it is understood that the cleaning solution 2N cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 20 (the Invention Described in Patent Document 11)

The semiconductor element shown in FIG. 1 was cleaned with a cleaning solution containing 0.3% by mass of hydrofluoric acid, 60% by mass of diethylene glycol monomethyl ether, 1% by mass of 2-ethyl-4-methylimidazole and 38.7% by mass of water (Table 4, cleaning solution 2O). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2O cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 21 (the Invention Described in Patent Document 12)

The semiconductor element shown in FIG. 1 was cleaned with a cleaning solution containing 0.1% by mass of hydrofluoric acid, 0.1% by mass of aminopropyltrimethoxysilane, 0.1% by mass of benzotriazol, 1% by mass of ethanol, 1% by mass of acetic acid and 97.7% by mass of water (Table 4, cleaning solution 2P). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2P cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 22 (the Invention Described in Patent Document 13)

The semiconductor element shown in FIG. 1 was cleaned with a cleaning solution containing 2% by mass of hydroxylamine sulfate, 3.4% by mass of tetramethylammonium hydroxide, 2% by mass of citric acid, 0.5% by mass of sorbitol and 92.1% by mass of water (Table 4, cleaning solution 2Q). Cleaning conditions and evaluation results are shown in Table 5. When using this cleaning solution, damage to the low-k film was successfully suppressed, but it was impossible to remove the photoresist and the tungsten-containing material was damaged. Accordingly, it is understood that the cleaning solution 2Q cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 23 (the Inventions Described in Patent Documents 14 and 15)

The semiconductor element shown in FIG. 1 was cleaned with a cleaning solution containing 5% by mass of ammonium acetate, 0.8% by mass of glycine, 0.18% by mass of ammonia, 3.6% by mass of dimethyl sulfoxide and 90.42% by mass of water (Table 4, cleaning solution 2R). Cleaning conditions and evaluation results are shown in Table 5. When using this cleaning solution, damage to the tungsten-containing material was successfully suppressed, but it was impossible to remove the photoresist and the low-k film was damaged. Accordingly, it is understood that the cleaning solution 2R cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 24 (the Invention Described in Patent Document 16)

The semiconductor element shown in FIG. 1 was cleaned with a cleaning solution containing 3.35% by mass of TMAH, 0.11% by mass of CyDTA, 1.64% by mass of hydrogen peroxide, 0.23% by mass of hexafluorosilicic acid and 94.67% by mass of water (Table 4, cleaning solution 2S). Cleaning conditions and evaluation results are shown in Table 5. When using this cleaning solution, it was impossible to remove the photoresist, and the tungsten-containing material and the low-k film were damaged. Accordingly, it is understood that the cleaning solution 2S cannot be used for the purpose of suppressing damage to the tungsten-containing material and the low-k film and removing the photoresist on the surface of the product to be treated in the process for manufacturing the semiconductor element that is the target of the present invention (Table 5).

Comparative Example 25

The semiconductor element shown in FIG. 1 was cleaned with a cleaning solution containing 1% by mass of KOH, 0.5% by mass of hexafluorosilicic acid and 98.5% by mass of water (Table 4, cleaning solution 2T). Cleaning conditions and evaluation results are shown in Table 5. When using this cleaning solution, the photoresist was successfully removed, but the tungsten-containing material and the low-k film were damaged. Accordingly, it is understood that the cleaning solution 2T cannot be used for the purpose of suppressing damage to the tungsten-containing material and the low-k film and removing the photoresist on the surface of the product to be treated in the process for manufacturing the semiconductor element that is the target of the present invention (Table 5).

TABLE 1

| Cleaning solution | pH | Alkali Type | Concentration % by mass | Alkaline earth metal compound Type | Concentration % by mass | Water Concentration % by mass |
|---|---|---|---|---|---|---|
| 1A | 13.3 | KOH | 1 | $Ba(NO_3)_2$ | 0.1 | 98.9 |
| 1B | 11.4 | $NH_3$ | 1 | $Ba(NO_3)_2$ | 0.2 | 98.8 |
| 1C | 14 | TMAH | 20 | $Ba(NO_3)_2$ | 0.1 | 79.9 |
| 1D | 12.4 | TEA | 10 | $Ba(NO_3)_2$ | 0.2 | 89.8 |
| 1E | 14 | TMAH | 20 | $Ba(NO_3)_2$ | 0.01 | 79.99 |
| 1F | 13.3 | KOH | 1 | $Ba(OH)_2$ | 0.1 | 98.9 |
| 1G | 13.3 | KOH | 1 | $BaCl_2$ | 0.1 | 98.9 |
| 1H | 13.1 | KOH | 1 | $Ca(NO_3)_2$ | 0.7 | 98.3 |
| 1I | 13.3 | KOH | 1 | $SrCl_2$ | 1 | 98 |

KOH: potassium hydroxide
$NH_3$: ammonia
TMAH: tetramethylammonium hydroxide
TEA: triethylamine
$Ba(NO_3)_2$: barium nitrate
$Ba(OH)_2$: barium hydroxide
$BaCl_2$: barium chloride
$Ca(NO_3)_2$: calcium nitrate
$SrCl_2$: strontium chloride

TABLE 2

| Examples | Cleaning solution | Temperature °C. | Immersion time min | Removal state I | Damage II | Damage III |
|---|---|---|---|---|---|---|
| 1 | 1A | 60 | 30 | E | E | E |
| 2 | 1B | 50 | 60 | E | E | E |
| 3 | 1C | 70 | 40 | E | E | G |
| 4 | 1C | 70 | 1 | E | E | E |
| 5 | 1D | 70 | 20 | E | G | E |
| 6 | 1E | 30 | 60 | E | E | G |
| 7 | 1F | 60 | 30 | E | G | G |
| 8 | 1G | 60 | 30 | E | E | G |
| 9 | 1H | 60 | 30 | E | E | E |
| 10 | 1I | 60 | 30 | E | G | G |

Removal state I: removal state of photoresist 3
Damage II: damage to tungsten-based material 1
Damage III: damage to low-k film 2

TABLE 3

| Cleaning solution | pH | Alkali Type | Concentration % by mass | Alkaline earth metal compound Type | Concentration % by mass | Water Concentration % by mass |
|---|---|---|---|---|---|---|
| 2A | 13.3 | KOH | 1 | — | — | 99 |
| 2B | 11.4 | $NH_3$ | 1 | — | — | 99 |
| 2C | 14 | TMAH | 20 | — | — | 80 |

KOH: potassium hydroxide
$NH_3$: ammonia
TMAH: tetramethylammonium hydroxide
TEA: triethylamine

TABLE 4

| Cleaning solution | Composition of cleaning solution (concentration: % by mass) |
|---|---|
| 2E | KOH: 0.005%, TMAH: 10%, DGME: 50%, pyrazole: 0.1%, water: 38.895% |
| 2F | benzotriazol: 0.1%, 1,2,4-triazole: 0.1%, ammonium fluoride: 5%, boric acid: 1%, water: 93.8% |
| 2G | ammonium fluoride: 0.25%, gluconic acid: 0.06%, water: 99.69% |
| 2H | phosphoric acid: 1.35%, hydrochloric acid: 1%, TMAH: 5%, sodium lauryl diaminoethyl glycinate: 0.01%, water: 92.64% |
| 2I | hydrogen peroxide: 5%, aminotriazole: 0.01%, water: 94.99% |
| 2J | hydrogen peroxide: 15%, benzyltrimethylaninionium hydroxide: 0.2%, Ethoquad O/12: 0.001%, water: 84.799% |
| 2K | octylamine: 1.9%, hydroxylamine sulfate: 6%, TMAH: 4.9%, formic acid: 2%, 2-methyl-4-pentanediol: 8%, water: 77.2% |
| 2L | N,N-diethylhydroxylamine: 20%, hydroxylamine: 2%, DMSO: 53%, catechol: 10%, water: 15% |
| 2M | TMAH: 10%, KOH: 0.02%, 2-phenyl-4-methylimidazole: 2%, DGME: 20%, water: 67.98% |
| 2N | hydrogen peroxide: 14%, hydrofluoric acid: 0.3%, DGME: 58.4%, vinylimidazole: 1%, water: 26.3% |
| 2O | hydrofluoric acid: 0.3%, DGME: 60%, 2-ethyl-4-methyl-imidazole: 1%, water: 38.7% |
| 2P | hydrofluoric acid: 0.1%, aminopropyltrimethoxysilane: 0.1%, benzotriazol: 0.1%, ethanol: 1%, acetic acid: 1%, water: 97.7% |
| 2Q | hydroxylamine sulfate: 2%, TMAH: 3.4%, citric acid: 2%, sorbitol: 0.5%, water: 92.1% |
| 2R | ammonium acetate: 5%, glycine: 0.8%, ammonia: 0.18%, DMSO: 3.6%, water: 90.42% |
| 2S | TMAH: 3.35%, CyDTA: 0.11%, hydrogen peroxide: 1.64%, hexafluorosilicic acid: 0.23%, water: 94.67% |
| 2T | KOH: 1%, hexafluorosilicic acid: 0.5%, water: 98.5% |

KOH: potassium hydroxide
TMAH: tetramethylammonium hydroxide
DGME: diethylene glycol monomethyl ether
Ethoquad O/12: [oleylbis(2-hydroxyethyl)methylammonium-bis(trifluoromethanesulfonyl)imide] (manufactured by Lion Corporation)
DMSO: dimethyl sulfoxide
CyDTA: trans-1,2-diaminocyclohexane-N,N,N',N'-tetraacetic acid monohydrate

TABLE 5

| Comparative Examples | Cleaning solution | Temperature °C. | Immersion time min | Removal state I | Damage II | Damage III |
|---|---|---|---|---|---|---|
| 1 | 2A | 60 | 30 | E | P | E |
| 2 | 2B | 50 | 60 | E | P | E |
| 3 | 2C | 70 | 40 | E | P | G |
| 4 | | 30 | 60 | E | P | G |
| 5 | 2D | 70 | 20 | E | P | E |
| 6 | 2E | 50 | 20 | E | P | F |
| 7 | | 25 | 0.5 | P | E | P |
| 8 | 2F | 50 | 6 | P | E | F |
| 9 | 2G | 25 | 1 | P | E | F |

TABLE 5-continued

| Comparative Examples | Cleaning solution | Temperature °C. | Immersion time min | Removal state I | Damage II | Damage III |
|---|---|---|---|---|---|---|
| 10 | 2H | 60 | 6 | E | E | P |
| 11 |  | 60 | 4 | P | E | P |
| 12 | 2I | 25 | 5 | P | P | E |
| 13 | 2J | 40 | 10 | P | P | E |
| 14 | 2K | 70 | 15 | P | E | P |
| 15 | 2L | 50 | 1 | E | E | P |
| 16 |  | 50 | 0.2 | P | E | P |
| 17 | 2M | 50 | 10 | E | P | F |
| 18 |  | 30 | 1 | P | E | P |
| 19 | 2N | 60 | 10 | P | P | F |
| 20 | 2O | 60 | 10 | P | E | F |
| 21 | 2P | 50 | 10 | P | E | F |
| 22 | 2Q | 70 | 30 | P | P | E |
| 23 | 2R | 30 | 10 | P | E | F |
| 24 | 2S | 40 | 0.5 | P | P | F |
| 25 | 2T | 60 | 30 | E | P | F |

Removal state I: removal state of photoresist 3
Damage II: damage to tungsten-based material 1
Damage III: damage to low-k film 2

INDUSTRIAL APPLICABILITY

When using the cleaning solution and the cleaning method of the present invention, in the process for manufacturing the semiconductor element, damage to the tungsten-containing material and the low-k film can be suppressed, the photoresist on the surface of the product to be treated can be removed, the semiconductor element having high precision and high quality can be produced with a high yield, and therefore these are industrially useful.

EXPLANATIONS OF LETTERS OR NUMERALS

1: tungsten-containing material
2: interlayer dielectric film (low-k film)
3: photoresist

The invention claimed is:

1. A cleaning method, comprising removing a photoresist on a surface of a semiconductor element having a low dielectric constant film (a low-k film) and a material that contains 10 atomic % or more of tungsten, wherein the method comprises:
applying a cleaning solution to the photoresist on the surface of the semiconductor element, wherein the cleaning solution consists of:
0.01 to 5% by mass of an alkaline earth metal compound;
0.1 to 30% by mass of an inorganic alkali, an organic alkali, or both;
water; and
optionally, at least one selected from the group consisting of an oxidant other than a peroxide, a metal anticorrosive, a water-soluble organic solvent, a reducing agent, and a chelating agent,
wherein the alkaline earth metal compound is at least one selected from the group consisting of barium nitrate, barium chloride, barium acetate, barium oxide, barium bromide, barium carbonate, barium fluoride, barium iodide, barium sulfate, barium phosphate, calcium nitrate and strontium chloride, and
wherein the organic alkali is at least one selected from the group consisting of methylamine, dimethylamine, trimethylamine, ethylamine, diethylamine, triethylamine, propylamine, dipropylamine, butylamine, butylamine, dibutylamine, pentlyamine, hexylamine, heptylamine, octylamine, ethanolamine, 2-methylethanolamine, diethanolamine, triethanolamine and 1-amino-2-propanol.

2. The cleaning method according to claim 1, wherein a pH value of the cleaning solution is 10 to 14.

3. The cleaning method according to claim 1, wherein the material that contains 10 atomic % or more of tungsten is at least one substance selected from the group consisting of tungsten oxide, tungsten nitride, tungsten and tungsten silicide.

4. The cleaning method according to claim 1, wherein the cleaning solution comprises at least one inorganic alkali selected from the group consisting of lithium hydroxide, lithium carbonate, lithium hydrogen carbonate, lithium acetate, sodium hydroxide, sodium carbonate, sodium hydrogen carbonate, sodium acetate, potassium hydroxide, potassium carbonate, potassium hydrogen carbonate, potassium acetate, cesium hydroxide, cesium carbonate, cesium hydrogen carbonate, cesium acetate and ammonia.

5. The cleaning method according to claim 1, wherein the cleaning solution does not substantially contain a perchloric acid or a perchlorate.

6. The cleaning method according to claim 1, wherein an amount of the alkaline earth metal compound in the cleaning solution is from 0.01 to 1% by mass with respect to an amount of the cleaning solution.

7. The cleaning method according to claim 1, wherein an amount of the alkaline earth metal compound in the cleaning solution is from 0.05 to 0.8% by mass with respect to an amount of the cleaning solution.

8. The cleaning method according to claim 1, wherein an amount of the inorganic alkali, the organic alkali, or both in the cleaning solution is from 0.5 to 25% by mass with respect to an amount of the cleaning solution.

9. The cleaning method according to claim 1, wherein an amount of the inorganic alkali, the organic alkali, or both in the cleaning solution is from 1 to 20% by mass with respect to an amount of the cleaning solution.

10. The cleaning method according to claim 1, wherein a pH value of the cleaning solution is 12 to 14.

* * * * *